(12) United States Patent
Bot et al.

(10) Patent No.: US 11,270,056 B2
(45) Date of Patent: Mar. 8, 2022

(54) METHOD AND APPARATUS FOR VERIFYING ELECTRONIC CIRCUITS

(71) Applicant: BQR Reliability Engineering Ltd., Rishon-Lezion (IL)

(72) Inventors: Yizhak Bot, Rishon-Lezion (IL); Alex Gonorovsky, Rishon-Lezion (IL); Isaac Rosenstein, Rishon-Lezion (IL)

(73) Assignee: BQR RELIABILITY ENGINEERING LTD., Rishon-Lezion (IL)

( * ) Notice: Subject to any disclaimer, the term of this patent is extended or adjusted under 35 U.S.C. 154(b) by 21 days.

(21) Appl. No.: 16/986,874

(22) Filed: Aug. 6, 2020

(65) Prior Publication Data
US 2022/0043958 A1 Feb. 10, 2022

(51) Int. Cl.
*G06F 30/398* (2020.01)
*G06F 30/3308* (2020.01)
*G01R 31/3183* (2006.01)
*G01R 31/01* (2020.01)
*G06F 30/333* (2020.01)

(52) U.S. Cl.
CPC ......... *G06F 30/398* (2020.01); *G01R 31/016* (2013.01); *G01R 31/31835* (2013.01); *G06F 30/333* (2020.01); *G06F 30/3308* (2020.01)

(58) Field of Classification Search
CPC ...... G06F 30/33; G06F 30/398; G06F 30/367; G06F 30/3308; G06F 30/333; G01R 31/016; G01R 31/31835
See application file for complete search history.

(56) References Cited

U.S. PATENT DOCUMENTS

| | | | | |
|---|---|---|---|---|
| 5,991,522 A * | 11/1999 | Shoen | ................... | G06F 30/367 716/103 |
| 6,102,960 A * | 8/2000 | Berman | ................. | G06F 30/33 703/17 |
| 6,279,146 B1 * | 8/2001 | Evans | ..................... | G06F 30/33 716/113 |
| 6,516,452 B2 * | 2/2003 | Meding | ................... | G06F 30/33 716/106 |
| 6,704,919 B2 * | 3/2004 | Araki | .................... | G06F 30/367 716/112 |
| 6,912,494 B1 * | 6/2005 | Ballam | ................ | G06F 30/367 703/4 |

(Continued)

*Primary Examiner* — Helen Rossoshek
(74) *Attorney, Agent, or Firm* — The Roy Gross Law Firm, LLC; Roy Gross

(57) ABSTRACT

A method, system and computer program product, the method comprising: obtaining circuit information, comprising description of groups of pins of electronic chips; obtaining a description of a test comprising a plurality of rules specifying: an identifier, a first group of pins, a second group of pins, a first action to take upon successful interconnection of the first and second groups, and a second action to take upon failure, wherein the first action and second actions are one of: finish with success, finish with failure, and a rule ID of a subsequent rule to check; checking the plurality of rules, comprising checking a sequence of rules starting with a first rule, and wherein each subsequent rule is selected as the first or second action of a preceding rule, in accordance with whether the preceding rule succeeded or failed, respectively; and outputting a result of the plurality of rules.

18 Claims, 9 Drawing Sheets

(56) References Cited

U.S. PATENT DOCUMENTS

| | | | | |
|---|---|---|---|---|
| 6,959,271 B1* | 10/2005 | Ballam | ................... | G06F 30/33 |
| | | | | 703/14 |
| 7,020,187 B1* | 3/2006 | Reid | ................... | H04M 11/066 |
| | | | | 375/220 |
| 7,103,703 B1* | 9/2006 | Reeves | ............... | G06F 13/4045 |
| | | | | 710/312 |
| 7,657,853 B2* | 2/2010 | Sato | ........................ | G06F 30/33 |
| | | | | 716/106 |
| 8,726,217 B2* | 5/2014 | Gullette | ................ | G06F 30/398 |
| | | | | 716/126 |
| 9,252,773 B2* | 2/2016 | Young | ..................... | G06F 30/34 |
| 10,606,974 B1* | 3/2020 | Acharya | ............... | G06F 30/392 |
| 10,664,644 B1* | 5/2020 | Bot | .................. | G01R 31/31917 |
| 10,990,731 B1* | 4/2021 | Odabasi | ................ | G06F 30/337 |
| 2003/0105620 A1* | 6/2003 | Bowen | ................... | G06F 30/33 |
| | | | | 703/22 |
| 2010/0306720 A1* | 12/2010 | Pikus | ................... | G06F 30/398 |
| | | | | 716/106 |
| 2012/0268150 A1* | 10/2012 | Luo | ...................... | G01R 1/0425 |
| | | | | 324/750.16 |
| 2021/0327239 A1* | 10/2021 | Falkenburg | ............ | G01N 21/17 |

\* cited by examiner

| Group | RefDes | Pin |
|---|---|---|
| AA0 | U13 | D21 |
| BB0 | U3 | R2 |
| CC0 | U3 | H2 |
| DD0 | U13 | D19 |
| EE0 | U3 | Y3 |
| JJ0 | U3 | C10 |

100, 104, 105, 106

| Group | RefDes | Pin |
|---|---|---|
| BUS_AA(1-5) | U13 | A26 |
| | U13 | A22 |
| | U13 | B21 |
| | U13 | B25 |
| | U13 | A24 |

108

| Group | RefDes | Pin |
|---|---|---|
| BUS_BB(1-5) | U3 | P2 |
| | U3 | R9 |
| | U3 | R10 |
| | U3 | R11 |
| | U3 | P11 |

112

| Group | RefDes | Pin |
|---|---|---|
| BUS_FF(0-7) | U13 | A20 |
| | U13 | C20 |
| | U13 | D20 |
| | U13 | E20 |
| | U13 | D18 |
| | U13 | E18 |
| | U13 | C18 |
| | U13 | A18 |

| Group | RefDes | Pin |
|---|---|---|
| BUS_GG(0-7) | U3 | AA2 |
| | U3 | Y2 |
| | U3 | V2 |
| | U3 | U2 |
| | U3 | U4 |
| | U3 | V4 |
| | U3 | Y4 |
| | U3 | AA4 |

| Group | RefDes | Pin |
|---|---|---|
| BUS_HH(0-7) | U3 | AA11 |
| | U3 | Y11 |
| | U3 | V11 |
| | U3 | U11 |
| | U3 | U9 |
| | U3 | V9 |
| | U3 | Y9 |
| | U3 | AA9 |

| Group | RefDes | Pin |
|---|---|---|
| BUS_CC(1-5) | U3 | J2 |
| | U3 | H9 |
| | U3 | H10 |
| | U3 | H11 |
| | U3 | J11 |

116

| Group | RefDes | Pin |
|---|---|---|
| BUS_KK(0-7) | U3 | B11 |
| | U3 | C11 |
| | U3 | E11 |
| | U3 | F11 |
| | U3 | F9 |
| | U3 | E9 |
| | U3 | C9 |
| | U3 | B9 |

| Group | RefDes | Pin |
|---|---|---|
| BUS_LL(0-7) | U3 | B2 |
| | U3 | C2 |
| | U3 | E2 |
| | U3 | F2 |
| | U3 | F4 |
| | U3 | E4 |
| | U3 | C4 |
| | U3 | B4 |

METHOD AND APPARATUS FOR VERIFYING ELECTRONIC CIRCUITS

TECHNICAL FIELD

The present disclosure relates to designing electronic circuits in general, and to a method and apparatus for assisting a designer of electronic circuits in verifying a design, in particular.

BACKGROUND

In order to start the design of a circuit, a specification needs to be received, which states the functionality that the finished design needs to provide. However, the specification does not indicate how this functionality is to be achieved. The specification is essentially a technical description of what the finished circuit has to achieve, and can include a variety of electrical requirements, such as the input and output signals of the circuit, the available power supplies, permitted power consumption, or the like. The specification can also set some physical parameters that the design must meet, such as size, weight, moisture resistance, temperature range, thermal output, vibration tolerance, acceleration tolerance, or the like.

The design process includes transforming the specification into a plan that contains all the information required for physically constructing the circuit. The process normally includes several stages.

First, the specification is converted into a block diagram of the various functions that the circuit must perform, at which stage the contents of each block are not considered, but only what the block does. This approach allows for breaking a possibly complicated task into smaller tasks which may be handled one after the other, or divided amongst members of a design team.

Each block may then be studied in more detail. In particular, the details of the electrical functions of the block are considered.

Then, the specific circuit components are chosen to carry out each function of the overall design. At this stage the physical layout and electrical connections of each component are also determined. This stage is usually done using a graphic user interface, in which the layout of the circuit is designed. Each element may have a designating property, such as a name property, and during design, each element of the design may be assigned value for the name property, wherein the name property value comprises a character string. The value of the name property may be used for identifying the element, searching, or the like. The value of the name property may be assigned by the designer according to his or her choice. A default value may be assigned automatically to each unnamed element by the design software.

Typically, a design comprises a multiplicity of interconnected blocks, each of which may be implemented as a printed circuit board.

The layout may then be tested, wherein testing may include connectivity verification of the design, followed by electrical simulation. The connectivity verification may require one or more tests, each test comprising one or more checks verifying the connectivity of two or more groups of pins.

Typically, electrical simulation starts with unit testing in which each block is tested independently of other blocks, wherein the signals input into a block are simulated. The unit testing phase may be followed by integration testing, in which two or more interconnected blocks are tested, such that the signals output by one block are input into another block.

Following testing and error correction, the resulting layout may be used for the production of a printed circuit board or Integrated circuit.

BRIEF SUMMARY

One exemplary embodiment of the disclosed subject matter is a computer-implemented method comprising: obtaining information of a circuit being designed, the information comprising description of two or more groups of identified pins, of one or more electronic chips; obtaining a description of one or more tests, each test comprising a plurality of rules, each rule of the plurality of rules specifying: a rule identifier, a first group of pins from the groups of identified pins, the first group having a first ordering, a second group of pins from the groups of identified pins, the second group having a second ordering, a first action to be taken upon successful interconnection of the first group and the second group, and a second action to be taken upon failed interconnection of the first group and the second group, wherein each of the first action and the second action is one of: finish with success, finish with failure, and a rule ID of a subsequent rule to be checked; checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and outputting at least a success or failure result of the plurality of rules. Within the method, each rule of the plurality of rules optionally appears at most once as a first action or a second action. Within the method, the test is optionally represented as a binary tree. Within the method, interconnection between the first group and the second group is optionally in accordance with matching the first ordering and the second ordering. Within the method, the interconnection between the first group and the second group is optionally in accordance with matching the first ordering and a reversing of the second ordering. Within the method, a pin of the first group optionally connects to a pin of the second group through an electronic component. Within the method, the electronic component is a capacitor or a resistor. Within the method, a rule is optionally successful if at least one pin of the first group connects to a corresponding pin of the second group. Within the method, a rule is optionally successful if all pins of the first group connect to corresponding pins of the second group. The method can further comprise outputting a report indicating a result for the test. Within the method, the report optionally comprises a result for each checked rule. Within the method, the groups of identified pins optionally comprise three or more groups of identified pins, and one or more rules of the sequence of rules optionally check connectivity between a third group of pins from the identified pins and another group of pins, selected from: the first group of pins, the second group of pins, and a fourth group of pins. Within the method, chips optionally comprise a first electronic chip comprising the first group of pins, and a second electronic chip comprising the second group of pins.

Another exemplary embodiment of the disclosed subject matter is a system having a processor, the processor being adapted to perform the steps of: obtaining information of a circuit being designed, the information comprising description of two or more groups of identified pins, of one or more electronic chips; obtaining a description of one or more tests, each test comprising a plurality of rules, each rule of the plurality of rules specifying: a rule identifier, a first group of pins from the groups of identified pins, the first group having a first ordering, a second group of pins from the groups of identified pins, the second group having a second ordering, a first action to be taken upon successful interconnection of the first group and the second group, and a second action to be taken upon failed interconnection of the first group and the second group, wherein each of the first action and the second action is one of: finish with success, finish with failure, and a rule ID of a subsequent rule to be checked; checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and outputting at least a success or failure result of the plurality of rules. Within the system, each rule of the plurality of rules optionally appears at most once as a first action or a second action. Within the system, the test is optionally represented as a binary tree. Within the system, the groups of identified pins optionally comprise three or more groups of identified pins, and a rule of the sequence of rules optionally checks connectivity between a third group of pins from the groups of identified pins and another group of pins, selected from: the first group of pins, the second group of pins, and a fourth group of pins.

Yet another exemplary embodiment of the disclosed subject matter is a computer program product comprising a non-transitory computer readable medium retaining program instructions, which instructions when read by a processor, cause the processor to perform a method comprising: obtaining information of a circuit being designed, the information comprising description of two or more groups of identified pins, of one or more electronic chips; obtaining a description of one or more tests, each test comprising a plurality of rules, each rule of the plurality of rules specifying: a rule identifier, a first group of pins from the groups of identified pins, the first group having a first ordering, a second group of pins from the groups of identified pins, the second group having a second ordering, a first action to be taken upon successful interconnection of the first group and the second group, and a second action to be taken upon failed interconnection of the first group and the second group, wherein each of the first action and the second action is one of: finish with success, finish with failure, and a rule ID of a subsequent rule to be checked; checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and outputting at least a success or failure result of the plurality of rules. Within the computer program product, each rule of the plurality of rules optionally appears at most once as a first action or a second action. Within the computer program product, the groups of identified pins optionally comprise three or more groups of identified pins, and a rule of the sequence of rules optionally checks connectivity between a third group of pins and another group of pins, selected from: the first group of pins, the second group of pins, and a fourth group of pins.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 1 shows a collection of pin groups, in accordance with some embodiments of the disclosure;

FIG. 4B shows an exemplary user interface for defining pin groups, in accordance with some embodiments of the disclosure;

FIG. 5 shows an exemplary user interface for defining and editing rules, in accordance with some embodiments of the disclosure;

DETAILED DESCRIPTION

Figure 2A:
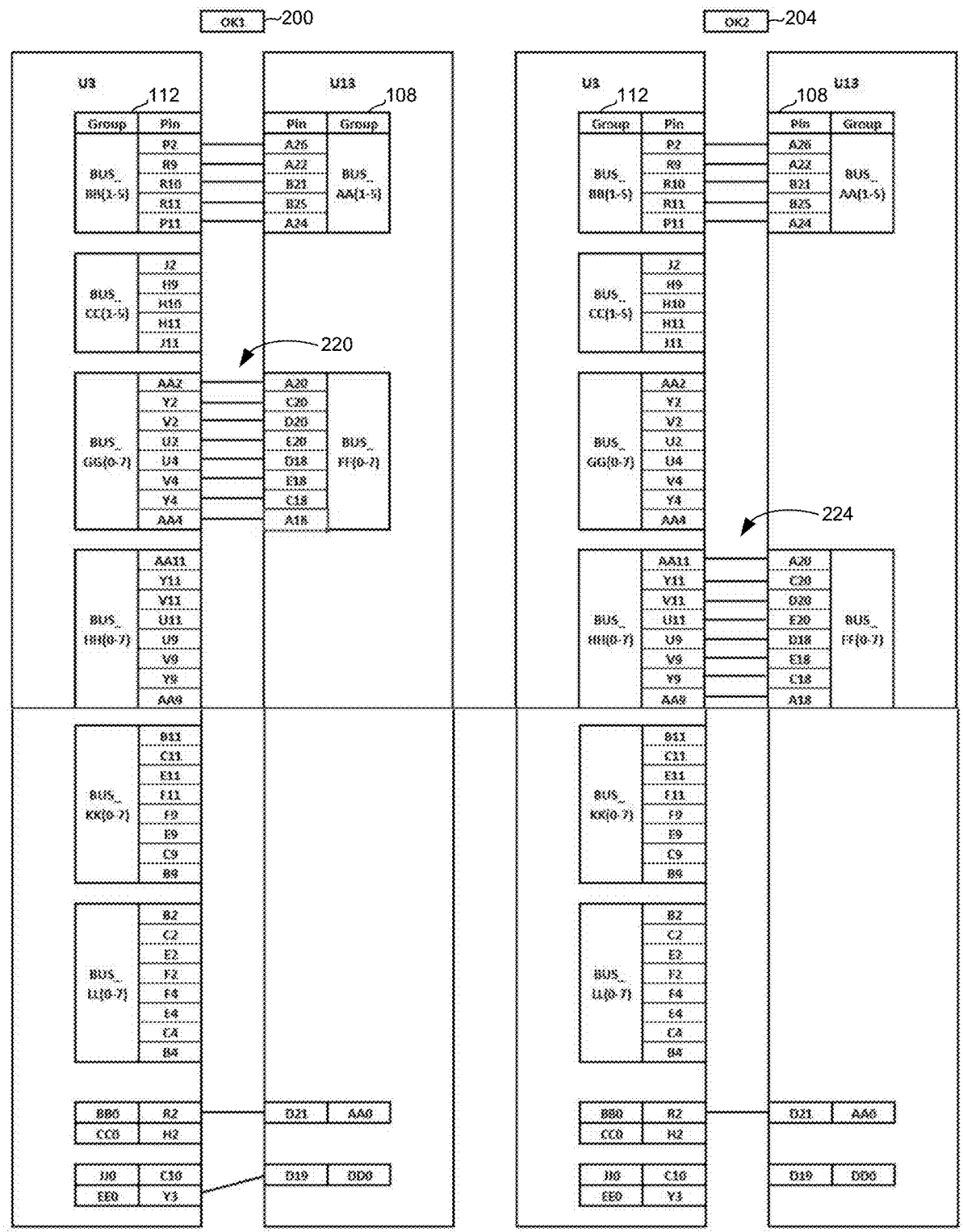
FIGS. 2A and 2B show legal connection combinations between two chips, in accordance with some embodiments of the disclosure.

The term "block" or "board" used in this specification should be expansively construed to cover the design of any kind of a collection of components performing one or more functions. Once the design and testing is completed, a block or a board may be implemented as a printed circuit board (PCB). A PCB mechanically supports and electrically connects electrical or electronic components using conductive tracks, pads and other features etched from one or more sheet layers of copper laminated onto and/or between sheet layers of a non-conductive substrate. Components are generally soldered onto the PCB to both electrically connect and mechanically fasten them to it.

The term "Net" used in this specification should be expansively construed to cover any kind of Net, i.e., a node connecting one or more elements in an electronic circuit. A net may connect components within a same block, or a component of a block to a connector which may connect to another block.

A design of a circuit typically comprises multiple groups of pins, such that each group needs to connect to one or more other groups of pins, whether the two groups of pins are on the same block or connect two separate blocks.

The connection between groups of pins in an electrical circuit may have a plurality of possible configurations. In a non-limiting example, a first group of pins may connect to a second group of pins in a first configuration of the circuit, and to a third group of pins in a second configuration of the circuit. In the first configuration, if the first group indeed connects to the second group, the third group may need to connect to a fourth group, while, in the second configuration, the second group may need to connect to a fourth group. This creates a plethora of possible checks which may be hard to manage.

Additionally or alternatively, any two connecting groups may have different possible manners of connecting, such as directly, via a resistor, a capacitor, a coil, or the like.

Additionally or alternatively, two connecting groups may connect in accordance with a predetermined order of the pins, for example the first pin of the first group may connect to the first pin of the second group, and so on. In other situations, the groups may connect in a reverse order, such that the first pin of the first group may connect to the last pin of the second group. In further situations, the groups may connect in any predetermined order.

Additionally or alternatively, for two pin groups to be connected, in some configurations it is enough that some of the pins are connected, while in other configurations it may be required that all pins of the first group are connected to the pins of the second group.

The groups that connect, and the manner of connection may depend on the particular circuit structure. For example, a chip vendor may offer a CPU chip that may connect to a multiplicity of memory chips. If connecting to a memory chip of a first type, the group of pins of the CPU chip connects to a first group of pins of the memory chip, and then further groups of pins of the CPU chip connect in one of a number of predetermined manners to other groups of pins of the memory chip. If the CPU chip connects to a memory chip of another type, the group of pins of the CPU chip connects to a different group of pins of the memory chip, and then further groups of pins of the CPU chip connect in one of a number of other predetermined manners to other groups of pins of the memory chip.

Thus, one technical problem dealt with by the disclosed subject matter relates to the need to verify one or more connections between groups of pins within a circuit. The connection may be between groups of pins associated with different components such as chips, but also between groups of pins within the same component. Each circuit configuration may require a different set of one or more tests, each test comprising a plurality of verification checks, also referred to as rules to be checked. Each rule may have different parameters depending on the configuration and/or the other checks in the test.

One technical solution provided by the disclosure comprises a user interface to be used by a user for defining groups of pins within a circuit, wherein each such group relates to pins that connect together to other groups.

The user may then define connectivity tests between the components, wherein each test comprises a collection of checks, also referred to as rules, of pin group connections. Thus, each such check may comprise an identifier, a first group of pins, a second group of pins, an ordering of the pins within the connection, whether a connection of a single pin is required or all pins need to connect, and whether the connection is direct or via a component (including the type of component). The check may also comprise an action, which may be: a success of the whole test, a failure of the whole test, another check to be performed if the check succeeds, and yet another check to be performed if the check fails.

The test, comprising the sequence of checks may be virtually described as a binary tree, wherein the leafs are of two types: success and failure, and wherein internal nodes lead to further checks, depending on their result. A path in the tree from the root to a leaf thus represents a series of checks that provide pass/fail a test result.

One technical effect of the disclosure relates to a method and apparatus for defining tests for automatically verifying connectivity in a multiplicity of circuit configurations. The test definition may include the possible check sequences for all configurations, including various parameters for each check.

Another technical effect of the disclosure relates to the option of using the test structure to accommodate further configurations. Even if changes are required to accommodate for a new configuration, such changes are usually minor and do not consume significant labor.

Yet another technical effect of the disclosure relates to the option of re-verifying connectivity after changing the circuit design for example when a new version becomes available, without having to redefine the whole test structure.

Referring now to FIG. 1, showing a collection of pin groups, as created by a user, for example by using the user interface shown on FIG. 4B detailed below. The collection comprises, among others, AA0 group (100), comprising pin D21 of chip U13; BB0 group (104) comprising pin R2 of chip U3; DD0 group (105) comprising pin D19 of chip U13; EE0 group (106) comprising pin Y3 of chip U3; group BUS_AA(1-5) (108) comprising pins A26, A22, B21, B25 and A24 of chip U13; group BUS_BB(1-5) (112) comprising pins P2, R9, R10, R11 and P11 of chip U3; and BUS_CC (1-5) (116) comprising pins J2, H9, H10, H11 and J11 of chip U3.

Figure 2B:
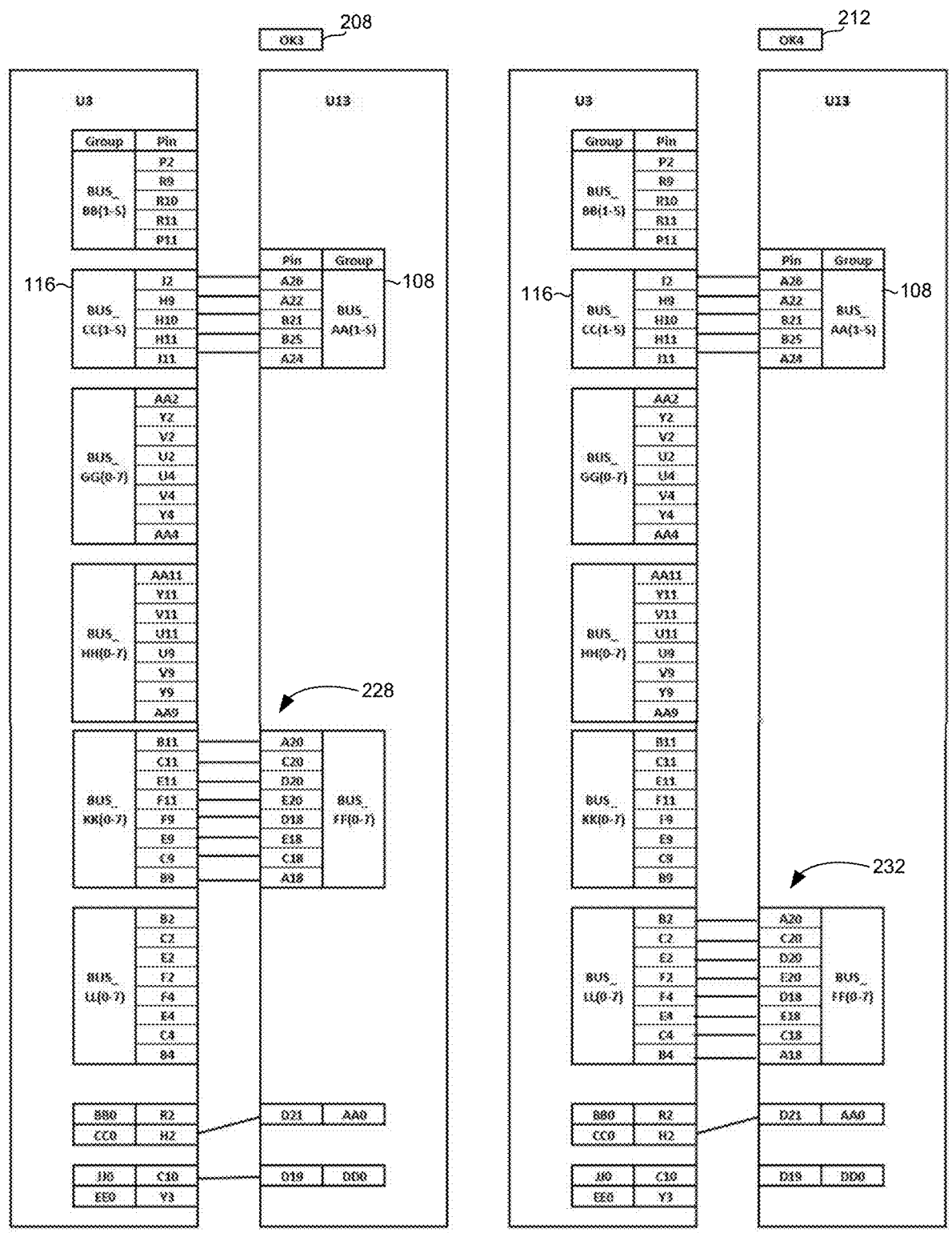

Referring now to FIG. 2A and FIG. 2B, each showing two legal connection combinations between chip U3 and chip U13. Thus, FIG. 2A shows combinations OK1 (200) and OK2 (204), and 2B shows combinations OK3 (208) and OK4 (212).

Each connection may be regarded as a rule, which may pass or fail for any configuration of chips U3 and U13.

In both combinations OK1 combination (200) and OK2 combination (204), group BUS_BB(1-5) (112) connects to BUS_AA(1-5) (108). However, on OK1 (200) BUS_GG(0-7) connects (220) to BUS_FF(0-7), while on OK2 combination (204) BUS_HH(0-7) connects (224) to BUS_FF(0-7).

In OK3 combination (208) and OK4 combination (212), group BUS_CC(1-5) (116) connects to BUS_AA(1-5) (108). However, on OK3 (208) BUS_KK(0-7) connects (228) to BUS_FF(0-7), while on OK4 (212) BUS_LL(0-7) connects (232) to BUS_FF(0-7). Further differences exist between combinations OK1 combination (200) and OK2 combination (204), and between OK3 combination (208) and OK4 combination (212).

Figure 3:
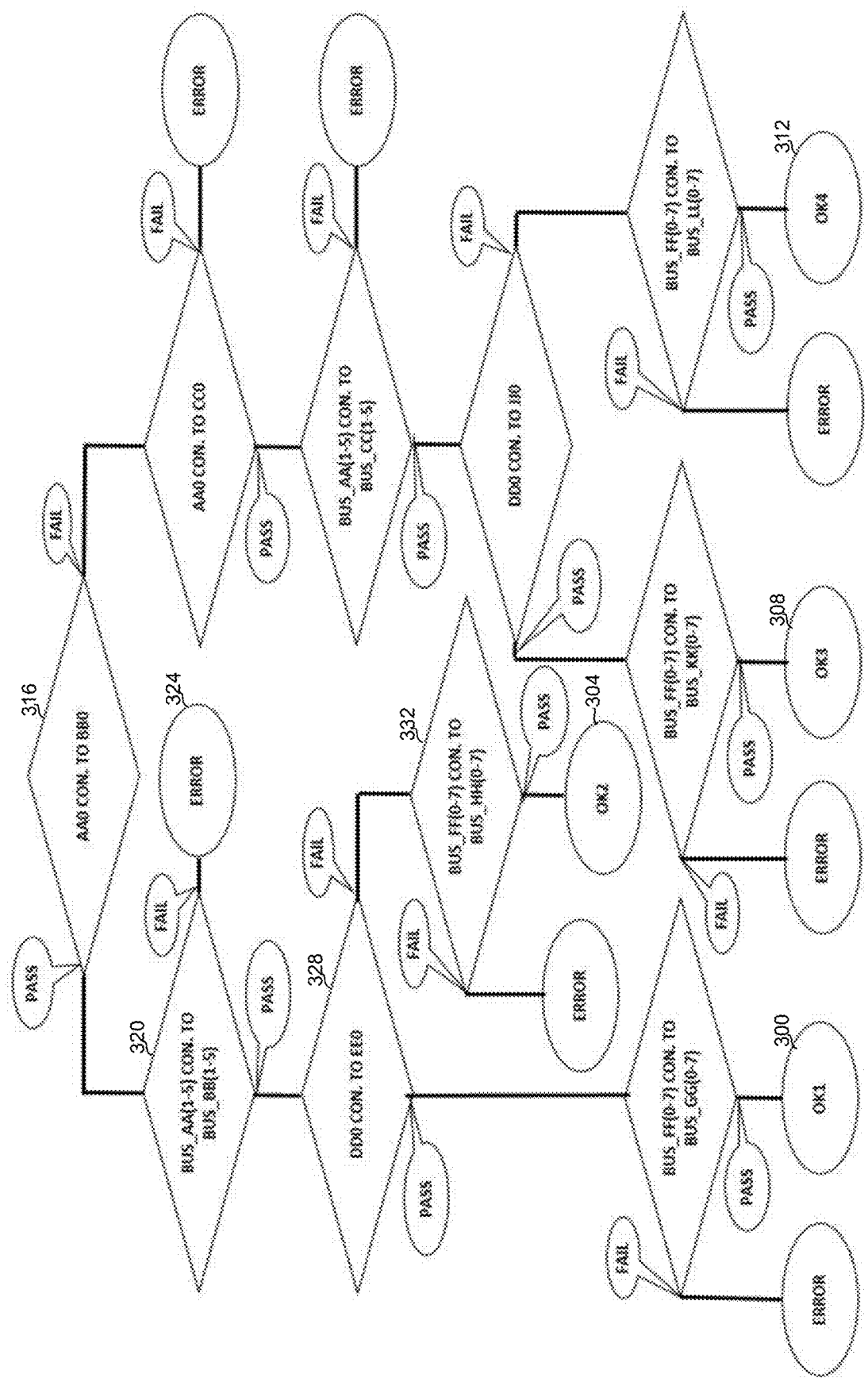
FIG. 3 shows a binary tree representation of the allowed connection combinations between chips, consistent with the legal connection combinations of FIGS. 2A and 2B, in accordance with some embodiments of the disclosure.

Referring now to FIG. 3, showing a binary tree representation of the allowed connection combinations between U3 and U13. Each internal node in the tree represents a connection or rule, and each leaf has an ERROR or OK state. Each OK state corresponds to one of the combinations: OK1 leaf (300) corresponds to OK1 combination (200), OK2 leaf (304) corresponds to OK2 combination (204), OK3 leaf (308) corresponds to OK3 combination (208), and OK4 leaf (312) corresponds to OK4 combination (212), meaning that the path from the root of the tree to an OK leaf represents the connections of one of allowed combinations.

For example, the path to OK2 leaf (204) is as follows: the first rule 316 checks whether AA0 (100) connects to BB0 (104). On OK combination 2 (204) this connection exists (PASS), thus the test proceeds to rule 320, to check whether BUS_AA(1-5) (108) connects to BUS_BB(1-5) (112). This connection exists (PASS) on OK combination 2 (204). It is noted, however, that if this connection did not exist, the test would fail and reach EROR state 324, since in all combinations in which AA0 connects to BB0, BUS_AA(1-5) (108) connects to BUS_BB(1-5) (112).

The test thus continues to check rule 328 which fails since on OK combination 2 (204) DD0 (105) does not connect to EE0 (106), and then rule 332 which passes since BUS_FF (0-7) connects (228) to BUS_HH(0-7), thus reaching OK 2 state (304).

The tree structure representation is shows for illustration only, and may be implemented using any required data structure. However, in some implementations, a visual representation of a tree may be displayed to a user, in order to clarify the checking sequence. In some embodiments, a path leading to the actual occurring result may be indicated on the graphic presentation, in order to show how the pass/fail result has been achieved.

It will also be appreciated that the tree representation is not unique, and the same tests can be represented in a multiplicity of equivalent manners, meaning that the same sequence of rule results will always lead to the same test result.

It will be appreciated that there may be multiple rules which are not reached form any other rule having pass or fail result, meaning that each may be a starting points for testing. In such case, it may be required to perform multiple tests for testing the connectivity of the circuit, starting with each of the starting rules. The tree representation will then comprise a forest, i.e., a multiplicity of trees.

Figure 4A:
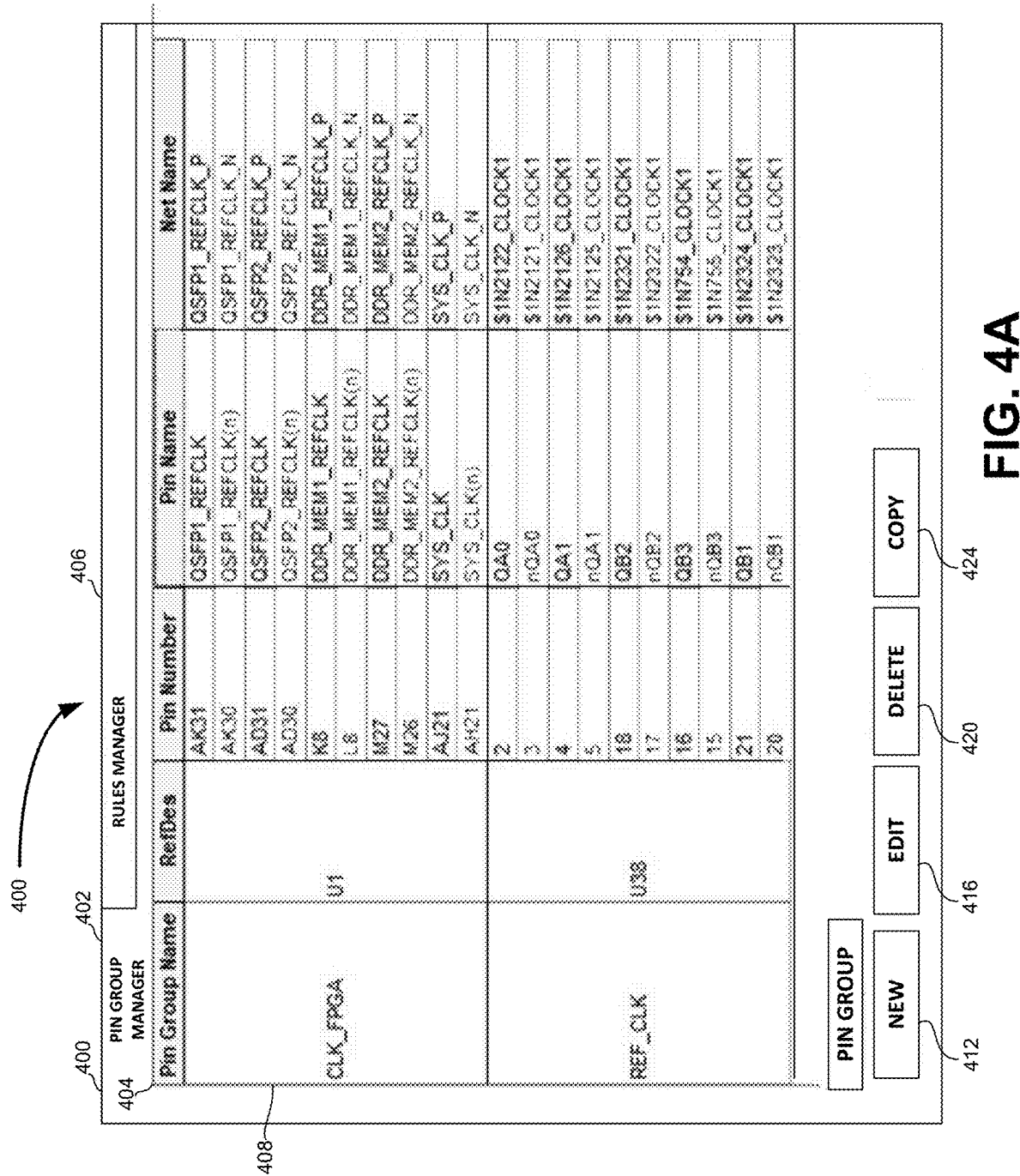
FIG. 4A shows an exemplary user interface displaying defined pin groups, in accordance with some embodiments of the disclosure.
Figures 4B, 5:
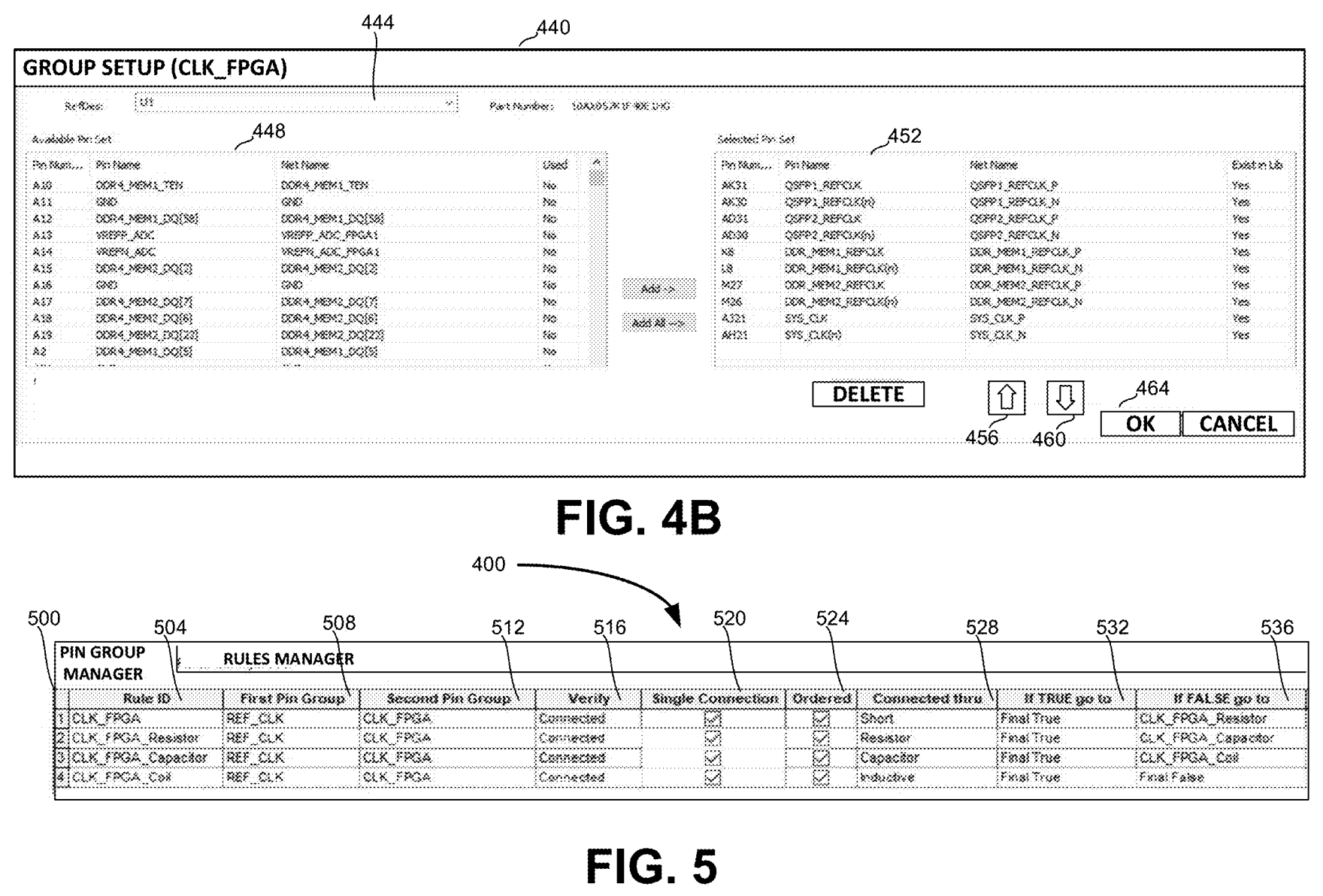

Referring now to FIGS. 4A and 4B, showing a user interface 400 for defining pin groups and rules. Table 404 of FIG. 4A, shown when the "Pin Group Manager" tab 402 is selected, shows a list of defined pin groups, such as pin group 408. Each such pin group has a name, a reference descriptor such as U1 being a field programmable gate array (FPGA) or U38 being a generator, and a pin number, pin name and net name for each pin group. The existing pin groups can be edited, deleted or copied, by pressing buttons 416, 420 or 424, respectively.

Upon pressing button 412, a new group may be created, as shown by group definition user interface 440 on FIG. 4B.

On FIG. 4B, once a component is selected, for example using drop down list 444, all pins of the component may be listed on pane 448, and the pin number, name and net name are displayed for each pin in the list. Each pin can be selected from pane 448 and added to the set shown on pane 452. The order of the pins in the group can be changed by selecting any of the pins and pressing "up" arrow 456 or "down" arrow 460. Once all required pins are contained in the group, the user can click on "OK" button 464, after which table 404 will be updated with the newly created group.

It will be appreciated that selecting "Edit" button 416 on the user interface shown on FIG. 4A, group definition user interface 440 will be opened and will show the current pins contained the group, which can then be edited.

Upon selecting Group manager tab 406, a user interface for defining a connection test for the circuit may be defined.

Referring now to FIG. 5, showing table 500 of a user interface for defining and editing rules. A new rule may be defined by starting a new row in table 500.

Each rule may comprise a rule ID 504, which may be textual, numeric, or the like; a first pin group identifier 508 and a second pin group identifier 512 which may be selected from the defined groups; an indication 516 whether it is required to verify that the first pin group and the second pin group are connected or disconnected; an indication 520 whether it is enough that a single pin of each pin group is connected for the pin groups to be considered as connected, or is it required that all pins are connected; an indication 524 whether the pin groups are to be connected as ordered or in reverse order; an indication 528 whether the groups are to be connected directly (short) or whether a component and which kind, e.g. a resistor, a capacitor or a coil; a first action 532 to be taken if the rule holds, and a second action 536 to be taken if the rule does not hold.

Figure 6:
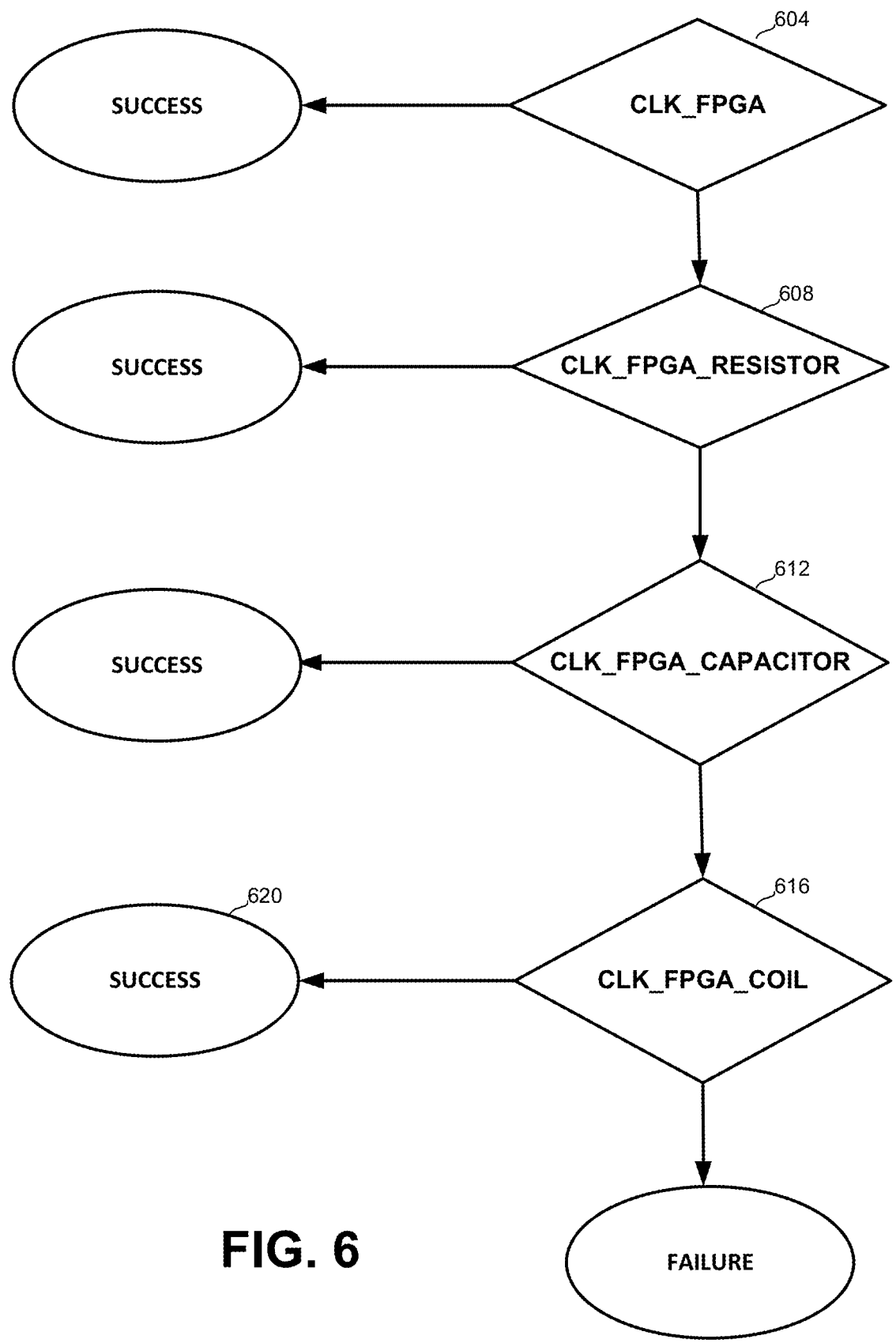
FIG. 6 shows a binary tree representation of the rules of FIG. 5, in accordance with some embodiments of the disclosure.

FIG. 6 shows a binary tree representation of the rules of table 500: rule 604 named CLK_FPGA checks whether the pin groups are connected directly, i.e., shortened. If they are, the test passes. If not, rule 608 named CLK_FPGA_RESISTOR checks whether the pin groups are connected through a resistor. If yes, the test has succeeded. If not, rule 612 named CLK_FPGA_CAPACITOR checks whether the pin groups are connected through a capacitor. If yes, the test has succeeded. If not, rule 616 named CLK_FPGA_COIL checks whether the pin groups are connected through a coil. If yes, the test has succeeded, and if not, the test has failed.

FIG. 3A and FIG. 3B above show a multiplicity of checks related to a plurality of pin groups, wherein different checks relate to different pin group combinations. In the example of FIG. 5 and FIG. 6, however, the test comprises a plurality of rules, all defined for the same two pin groups in the same pin order, wherein the rules differ only in how the groups are connected.

Figure 7:
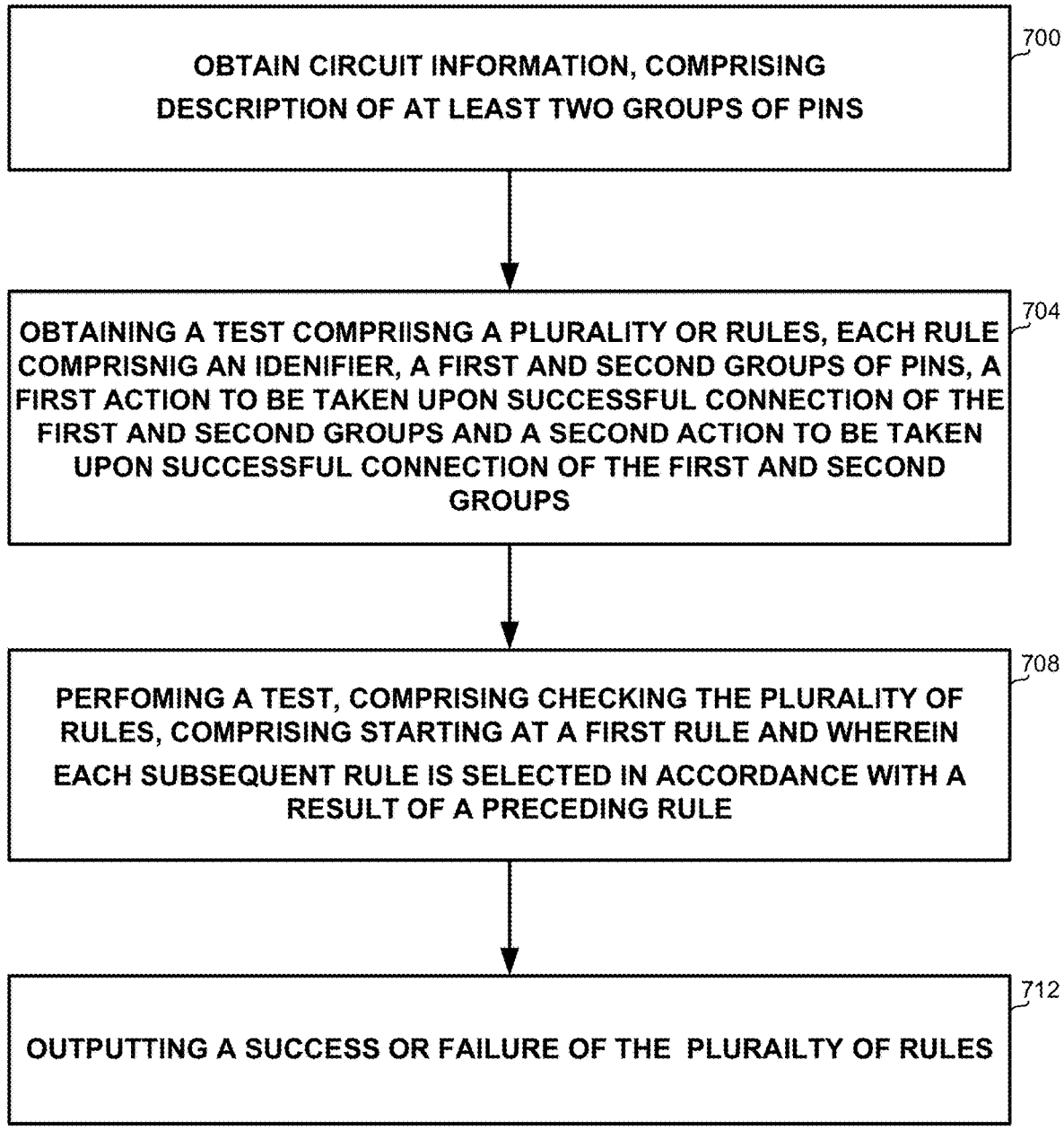
FIG. 7 shows a flowchart of steps in a method for verifying connectivity in a circuit design, in accordance with some embodiments of the disclosure.

Referring now to FIG. 7, showing a flowchart of steps in a method for verifying connectivity in a circuit design, in accordance with some embodiments of the disclosure.

On step 700, circuit information may be obtained. The circuit information may include the participating components and the pins of each component, the connectors, or the like.

The information may also include the definition of at least two groups of pins, wherein the pins of each group are in a specific order. The groups may be received, for example, from a user by user interface as shown in FIGS. 4A and 4B above, read from a file, retrieved from a storage device, received over a communication channel, or the like.

On step 704, one or more tests may be obtained, wherein each test may comprise a plurality of rules to be checked. Each rule may comprise an identifier such as a rule id, a first pin group and a second pin group, which may belong to the same or to different chips, a first action to be taken if the connection between the first group and the second group is as indicated by the rule, and a second action to be taken otherwise. The rules may comprise additional parameters, such as but not limited to whether the rule requires that the groups of pins are connected or disconnected, whether the groups of pins are to be connected according to their order or in a reverse order, whether the connection is direct or through a component, and what type of component, or the like. Unless noted otherwise, a rule may have default values for these parameters, for example that the groups are to be connected rather than disconnected, connected according to their order, and connected directly.

The rules may be received, for example, from a user by user interface as shown in FIG. 5 above, read from a file, retrieved from a storage device, received over a communication channel, or the like.

On step 708, one or more of the defined tests may be performed. Performing each test may comprise checking the plurality of rules of the test, starting at a first test which no other test comprises as an action. Checking the sequence of rules may then proceed, wherein each rule is selected in accordance with the result of a preceding rule. If the rule has passed, i.e. the groups are connected as required, the first action of the rule may take place, including declaring that the test has passed, or continuing to check another rule. If the rule has failed, i.e., the groups are not connected as required, the second action of the rule may take place, including declaring that the test has failed, or continuing to check another rule. Further tests may then be performed in the same manner.

Prior to starting the test, a data structure may be constructed which represents the test, for example a binary tree implemented as an array, as a list, or the like.

The tests may be run a plurality of times, for example upon different circuits, upon evolving versions of a circuit, or the like.

On step 712, the test results may be output to a user, including a pass or fail result for the test. The output may be provided using a visual display, a textual display, stored within a file, displayed over a display device, as played audio, or the like.

In some embodiments, the output may also comprise intermediate results, such as a list of the performed rules and the result of each rule.

Figure 8:
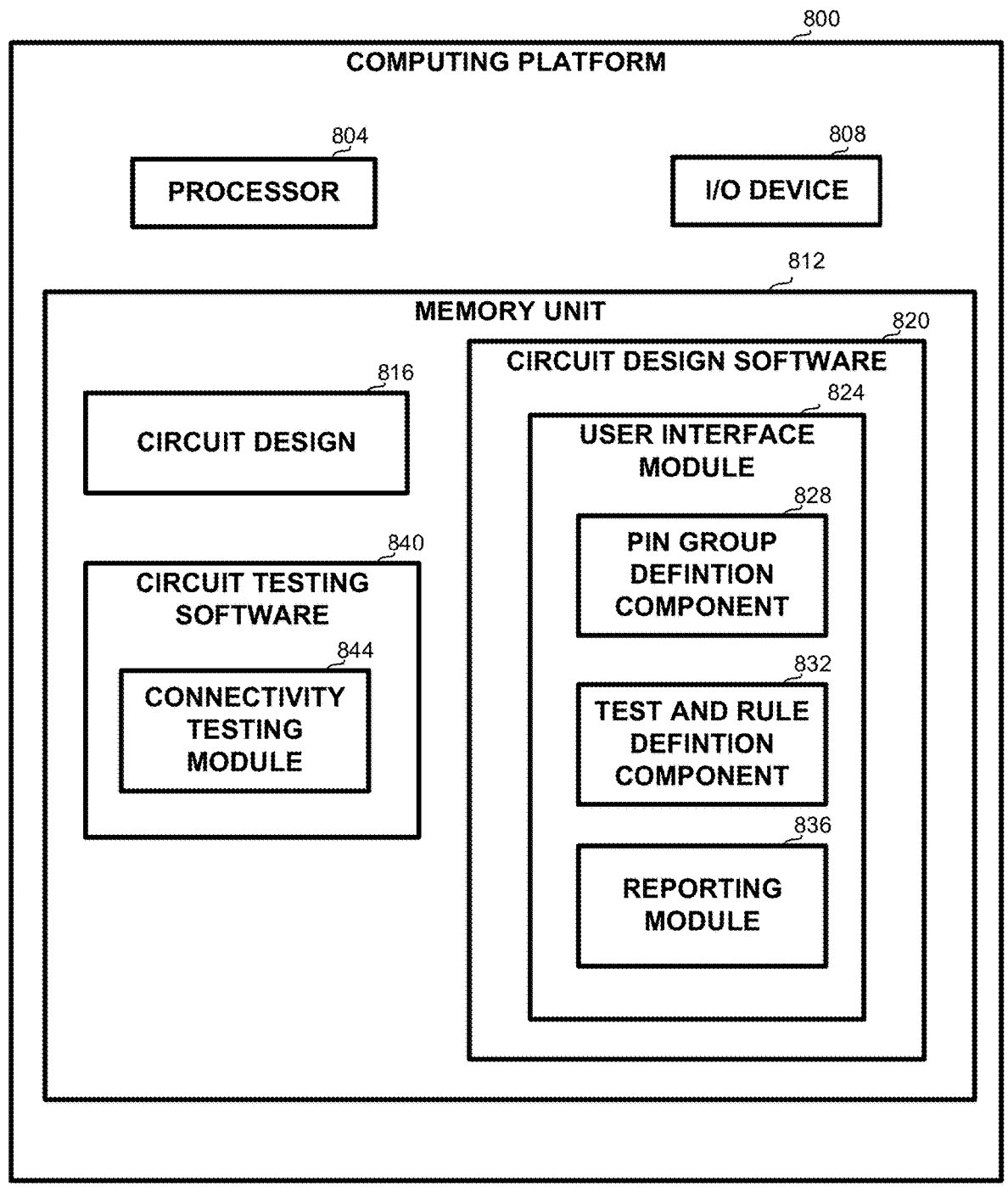
FIG. 8 shows a block diagram of a computing device configured for verifying connectivity in a circuit design, in accordance with some exemplary embodiments of the disclosed subject matter.

For example, in the tree shown in FIG. 6, if the result is success 620, the output may comprise the following report:
TEST: PASS
CHECK_FPGA: FAIL <connected through wrong component>
CHECK_FPGA_RESISTOR: FAIL <connected through wrong component>
CHECK_FPGA_CAPACITOR: FAIL <connected through wrong component>
CHECK_FPGA_COIL: PASS Referring now to FIG. 8, showing a block diagram of a computing platform 800 for testing a multi-block circuit, in accordance with some exemplary embodiments of the disclosed subject matter.

In some exemplary embodiments computing platform 800 may comprise a processor 804, which may be a Central Processing Unit (CPU), a microprocessor, an electronic circuit, an Integrated Circuit (IC) or the like. Processor 804 may be utilized to perform computations required by computing platform 800 or any of it subcomponents. Processor 804 may be configured to execute computer-programs useful in performing the method of FIG. 7 above.

In some exemplary embodiments, one or more I/O devices 808 may be configured to receive input from and provide output to a user. In some exemplary embodiments, I/O devices 808 may be utilized to present to the user a user interface, obtain user definitions for the pin groups and for the tests, and display the test results. I/O devices 808 may comprise a keyboard, a mouse, a touch screen or another pointing or tracking device, a voice activated device, or the like.

In some exemplary embodiments computing platform 800 may comprise a memory unit 812. Memory unit 812 may be a short-term storage device or long-term storage device. Memory unit 812 may be a persistent storage or volatile storage. Memory unit 812 may be a disk drive, a Flash disk, a Random Access Memory (RAM), a memory chip, or the like. Memory unit 812 may be a single memory device, or multiple interconnected memory devices which may be co-located or located in different locations and communicating via any communication channel.

In some exemplary embodiments, memory unit 812 may retain program code operative to cause processor 804 to perform acts associated with any of the subcomponents of computing platform 800. In some exemplary embodiments, memory unit 812 may retain program code operative to cause processor 804 to perform acts associated with any of the steps shown in FIG. 7 above.

Memory unit 812 may retain circuit design 816 for one or more circuits. The circuit design may have been created using circuit design software 820, imported from another storage device, or otherwise received. Circuit design 816 may also be stored on a memory unit or a database associated with another computing platform, which is in communication with computing platform 800. Circuit design 816 may also comprise the pin group definitions and the connectivity tests and rule definitions generated in accordance with the disclosure.

The components detailed below may be implemented as one or more sets of interrelated computer instructions, executed for example by processor 804 or by another processor. The components may be arranged as one or more executable files, dynamic libraries, static libraries, methods, functions, services, or the like, programmed in any programming language and under any computing environment.

Memory unit 812 may retain circuit design software 820, such as any CAD software, designed for editing circuits. In addition to all conventional components of any CAD software, circuit design software 820 may comprise a user interface module 824, configured to display a user interface and receive information from a user, such as the user interface shown on FIGS. 4A, 4B and 5.

User interface module 824 may comprise a pin group definition component 828 similar to the user interface shown in FIGS. 4A and 4B above, with which a user can define pin groups by selecting various pins from a chip specification and ordering them in a required order.

User interface module 824 may comprise a test and rule definition component 832 similar to the user interface shown in FIG. 5 above, with which the user can define tests and rules, also referred to as checks.

User interface module 824 may comprise reporting module 836, for outputting results of one or more tests, possibly with indications for the results of the various rules.

Memory unit 812 may retain circuit testing module 840, for testing the circuit design. In particular, circuit testing module 840 may include connectivity testing module 844 for performing one or more tests as defined using test and rule definition component 832.

It will be appreciated that the method and apparatus can also be used for assigning values to the name property of other components, such that a user can select certain characteristics and/or enter text describing values for other one or more characteristics. A value can then be generated for the component using the selected or entered values in accordance with a predetermined scheme.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    obtaining information of a circuit being designed, the information comprising description of at least two groups of identified pins, of at least one electronic chip;
    obtaining a description of at least one test, the at least one test comprising a plurality of rules, each rule of the plurality of rules specifying:
        a rule identifier,
        a first group of pins from the at least two groups of identified pins, the first group having a first ordering,
        a second group of pins from the at least two groups of identified pins, the second group having a second ordering,
        a first action to be taken upon successful interconnection of the first group and the second group wherein the successful interconnection is in accordance with the first ordering and the second ordering, and
        a second action to be taken upon failed interconnection of the first group and the second group, wherein the failed interconnection is in accordance with the first ordering and the second ordering, wherein each of the first action and the second action is one of: finish with success, finish with failure, and a rule ID of a subsequent rule to be checked,
        wherein the test is represented as a binary tree;
    checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and
    outputting at least a success or failure result of the plurality of rules.

2. The method of claim 1, wherein each rule of the plurality of rules appears at most once as a first action or a second action.

3. The method of claim 1, wherein the interconnection between the first group and the second group is in accordance with matching the first ordering and the second ordering.

4. The method of claim 1, wherein the interconnection between the first group and the second group is in accordance with matching the first ordering and a reversing of the second ordering.

5. The method of claim 1, wherein a pin of the first group connects to a pin of the second group through an electronic component.

6. The method of claim 5, wherein the electronic component is a capacitor or a resistor.

7. The method of claim 1, wherein a rule is successful if at least one pin of the first group connects to a corresponding pin of the second group.

8. The method of claim 1, wherein a rule is successful if all pins of the first group connect to corresponding pins of the second group.

9. The method of claim 1, further comprising outputting a report indicating a result for the test.

10. The method of claim 9, wherein the report comprises a result for each checked rule.

11. The method of claim 1, wherein the at least two groups of identified pins comprise at least three groups of identified pins, and wherein at least one rule of the sequence of rules checks connectivity between a third group of pins from the at least two groups of identified pins and another group of pins, selected from: the first group of pins, the second group of pins, and a fourth group of pins.

12. The method of claim 1, wherein the at least one electronic chip comprises at least a first electronic chip comprising the first group of pins, and a second electronic chip comprising the second group of pins.

13. A system having a processor, the processor being adapted to perform the steps of:
    obtaining information of a circuit being designed, the information comprising description of at least two groups of identified pins, of at least one electronic chip;
    obtaining a description of at least one test, the at least one test comprising a plurality of rules, each rule of the plurality of rules specifying:
        a rule identifier,
        a first group of pins from the at least two groups of identified pins, the first group having a first ordering,
        a second group of pins from the at least two groups of identified pins, the second group having a second ordering,
        a first action to be taken upon successful interconnection of the first group and the second group, wherein the successful interconnection is in accordance with the first ordering and the second ordering, and
        a second action to be taken upon failed interconnection of the first group and the second group, wherein the failed interconnection is in accordance with the first ordering and the second ordering, wherein each of the first action and the second action is one of: finish with success, finish with failure, and a rule ID of a subsequent rule to be checked,
        wherein the test is represented as a binary tree;
    checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and
    outputting at least a success or failure result of the plurality of rules.

14. The system of claim 13, wherein each rule of the plurality of rules appears at most once as a first action or a second action.

15. The system of claim 13, wherein the at least two groups of identified pins comprise at least three groups of identified pins, and wherein at least one rule of the sequence of rules checks connectivity between a third group of pins from the at least two groups of identified pins and another group of pins, selected from: the first group of pins, the second group of pins, and a fourth group of pins.

16. A computer program product comprising a computer readable storage medium retaining program instructions, which program instructions when read by a processor, cause the processor to perform a method comprising:

obtaining information of a circuit being designed, the information comprising description of at least two groups of identified pins, of at least one electronic chip;

obtaining a description of at least one test, the at least one test comprising a plurality of rules, each rule of the plurality of rules specifying:

a rule identifier, a first group of pins from the at least two groups of identified pins, the first group having a first ordering, a second group of pins from the at least two groups of identified pins, the second group having a second ordering, a first action to be taken upon successful interconnection of the first group and the second group, wherein the successful interconnection is in accordance with the first ordering and the second ordering, and a second action to be taken upon failed interconnection of the first group and the second group, wherein the failed interconnection is in accordance with the first ordering and the second ordering, wherein each of the first action and the second action is one of: finish with success, finish with failure, and a rule ID of a subsequent rule to be checked, wherein the test is represented as a binary tree;

checking the plurality of rules in regard of the circuit, comprising checking a sequence of rules from the plurality of rules starting with a first rule, and wherein each subsequent rule from the sequence of rules is selected as the first action or the second action of a preceding rule, in accordance with whether the preceding rule succeeded or failed, respectively; and outputting at least a success or failure result of the plurality of rules.

17. The computer program product of claim 16, wherein each rule of the plurality of rules appears at most once as a first action or a second action.

18. The computer program product of claim 16, wherein the at least two groups of identified pins comprise at least three groups of identified pins, and wherein at least one rule of the sequence of rules checks connectivity between a third group of pins from the at least two groups of identified pins and another group of pins, selected from: the first group of pins, the second group of pins, and a fourth group of pins.

* * * * *